United States Patent
Tornquist Hennig et al.

(10) Patent No.: US 7,777,318 B2
(45) Date of Patent: Aug. 17, 2010

(54) WAFER LEVEL PACKAGING INTEGRATED HYDROGEN GETTER

(75) Inventors: Kelly Jill Tornquist Hennig, Torrance, CA (US); Patty Pei-Ling Chang-Chien, Redondo Beach, CA (US); Xianglin Zeng, Monterey Park, CA (US); Jeffrey Ming-Jer Yang, Cerritos, CA (US)

(73) Assignee: Northrop Grumman Systems Corporation, Los Angeles, CA (US)

(*) Notice: Subject to any disclaimer, the term of this patent is extended or adjusted under 35 U.S.C. 154(b) by 0 days.

(21) Appl. No.: 11/782,460

(22) Filed: Jul. 24, 2007

(65) Prior Publication Data

US 2009/0026598 A1    Jan. 29, 2009

(51) Int. Cl.
*H01L 23/20* (2006.01)
(52) U.S. Cl. .................................................. 257/682
(58) Field of Classification Search ................. 257/682, 257/686, 704, 710
See application file for complete search history.

(56) References Cited

U.S. PATENT DOCUMENTS

| | | | |
|---|---|---|---|
| 5,491,361 A | 2/1996 | Stupian et al. | |
| 6,369,442 B1 | 4/2002 | Saito | |
| 6,423,575 B1 | 7/2002 | Tran et al. | |
| 6,548,889 B2 | 4/2003 | Saito | |
| 6,703,701 B2 | 3/2004 | Baudet et al. | |
| 6,822,880 B2 | 11/2004 | Kovacs et al. | |
| 6,825,817 B2 | 11/2004 | Kovacs et al. | |
| 6,853,062 B1 * | 2/2005 | Saito | 257/682 |
| 6,902,656 B2 | 6/2005 | Ouellet et al. | |
| 6,958,260 B2 | 10/2005 | Bedinger et al. | |
| 6,969,635 B2 | 11/2005 | Patel et al. | |
| 6,995,034 B2 | 2/2006 | Patel et al. | |
| 6,995,040 B2 | 2/2006 | Patel et al. | |
| 7,019,605 B2 * | 3/2006 | Larson, III | 333/187 |
| 7,067,397 B1 | 6/2006 | Chang-Chien et al. | |
| 7,078,268 B1 | 7/2006 | Geosling | |
| 7,091,605 B2 * | 8/2006 | Boroson et al. | 257/723 |
| 2002/0063323 A1 * | 5/2002 | Saito | 257/682 |
| 2003/0062610 A1 | 4/2003 | Kovacs et al. | |
| 2003/0071339 A1 | 4/2003 | Baudet et al. | |
| 2003/0217915 A1 | 11/2003 | Ouellet et al. | |
| 2005/0260792 A1 | 11/2005 | Patel et al. | |
| 2005/0260793 A1 | 11/2005 | Patel et al. | |

* cited by examiner

*Primary Examiner*—Steven Loke
*Assistant Examiner*—Kimberly M Thomas
(74) *Attorney, Agent, or Firm*—John A. Miller; Miller IP Group, PLC

(57) ABSTRACT

A wafer-level package that employs one or more integrated hydrogen getters within the wafer-level package on a substrate wafer or a cover wafer. The hydrogen getters are provided between and among the integrated circuits on the substrate wafer or the cover wafer, and are deposited during the integrated circuit fabrication process. In one non-limiting embodiment, the substrate wafer is a group III-V semiconductor material, and the hydrogen getter includes a titanium layer, a nickel layer, and a palladium layer.

12 Claims, 2 Drawing Sheets

US 7,777,318 B2

WAFER LEVEL PACKAGING INTEGRATED HYDROGEN GETTER

GOVERNMENT CONTRACT

The U.S. Government may have a paid-up license in this invention and the right in limited circumstances to require the patent owner to license others on reasonable terms as provided for by the terms of Contract No. FA8750-06-C-0051 awarded by the United States Air Force/Air Force Research Laboratory.

BACKGROUND OF THE INVENTION

1. Field of the Invention

This invention relates generally to a wafer-level package for an integrated circuit that includes a hydrogen getter and, more particularly, to a wafer-level package for one or more integrated circuits that includes an integrated hydrogen getter within and around the integrated circuits.

2. Discussion of the Related Art

It is known in the art to provide wafer-level packages for integrated circuits, such as monolithic millimeter-wave integrated circuits (MMIC), formed on a substrate or cover wafer. In one wafer-level packaging design, a cover wafer is mounted to the substrate wafer using a bonding ring so as to provide a hermetically sealed cavity in which the integrated circuits are provided. Typically, many integrated circuits are formed on the substrate or the cover wafer, where one or more integrated circuits are surrounded by a separate bonding ring. The cover wafer(s) and substrate wafer are then diced between the bonding rings to separate the packages for each separate or combined integrated circuit.

Some of the materials used in fabricating semiconductor integrated circuit devices in wafer-level packages are degraded by hydrogen. For example, certain metal films, such as titanium and platinum, used in the fabrication of integrated circuits react with hydrogen and degrade overtime, eventually rendering the device inoperative. Hydrogen degradation is particularly a problem for high electron mobility transistors (HEMT) that may be included in monolithic millimeter-wave integrated circuits because these devices may have thin nitride passivation layers, allowing hydrogen to penetrate through the thin passivation and degrade the protected metal films underneath.

Hydrogen is able to collect within the hermetically sealed package because hydrogen atoms are very small, and they are slowly able to penetrate into the package from the outside.

In order to alleviate hydrogen degradation of integrated circuit components within wafer-level packages, it has been proposed in the art to provide hydrogen getters within the wafer-level package that absorb the hydrogen to remove it from the sealed cavity. Particularly, it is known in the art to deposit certain layers of material within the wafer-level package that operate to absorb hydrogen that may otherwise degrade some of the semiconductor materials.

FIG. 1 is a cross-sectional view of a wafer-level package 10 including a semiconductor substrate wafer 12 on which one or more integrated circuits 14 have been fabricated by well known processes. A bonding ring 16 is formed on the semiconductor substrate wafer 12, and is bonded to a bonding ring on a cover wafer 20 so as to provide a hermetically sealed cavity 22 in which the integrated circuits 14 are provided. Signal lines and ground lines (not shown) would be provided within the package 10 to the outside, either through the substrate wafer 12 or the cover wafer 20 using vias, or laterally through the bonding ring 16, to make electrical connections to the integrated circuits 14. It has been proposed in the art to deposit a hydrogen getter 30 on an under-side of the cover wafer 20 within the cavity 22 that acts to absorb hydrogen within the cavity 22. In practice, the hydrogen getter may be deposited on other surfaces within the wafer level package.

FIG. 2 is a cross-sectional view of a portion of the hydrogen getter 30 deposited on the cover wafer 20 including a plurality of hydrogen getter layers. Particularly, the hydrogen getter 30 includes a plurality of metal layers deposited on either the substrate wafer 12 or the cover wafer 20, including but limited to, in no particular order, titanium layers 32, 36 and 40, nickel layers 34 and 38, and a palladium layer 42. The order and thickness of these layers may be varied and adjusted according to the need.

SUMMARY OF THE INVENTION

In accordance with the teachings of the present invention, a wafer-level package is disclosed that employs one or more integrated hydrogen getters within the wafer-level package on any wafer. The hydrogen getter is provided anywhere between and among the integrated circuits on the substrate wafer or cover wafer, and is deposited during the integrated circuit fabrication process. In one non-limiting embodiment, the substrate wafer and the cover wafer are a group III-V semiconductor material, and the hydrogen getter may include a titanium layer(s), a nickel layer(s), and a palladium layer(s).

Additional features of the present invention will become apparent from the following description and appended claims, taken in conjunction with the accompanying drawings.

DETAILED DESCRIPTION OF THE EMBODIMENTS

The following discussion of the embodiments of the invention directed to a wafer-level package including integrated hydrogen getters on a semiconductor substrate wafer is merely exemplary in nature, and is in no way intended to limit the invention or its applications or uses.

Figure 1:
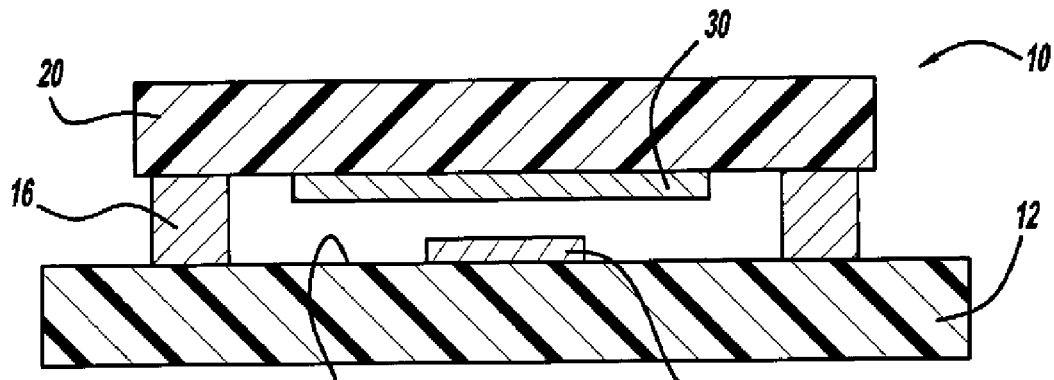
FIG. 1 is a cross-sectional view of a wafer-level package employing a known hydrogen getter.
Figure 2:
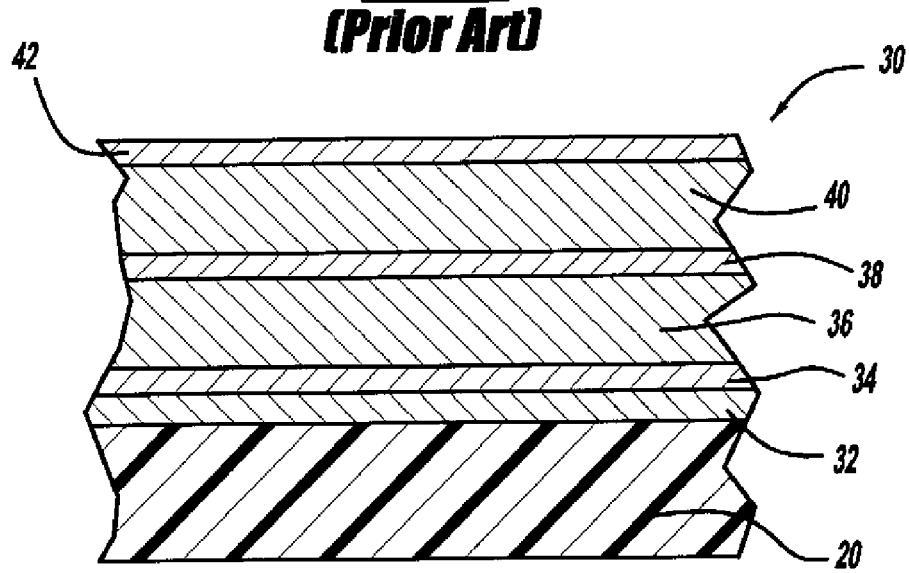
FIG. 2 is a cross-sectional view of the hydrogen getter shown in FIG. 1.
Figure 3:
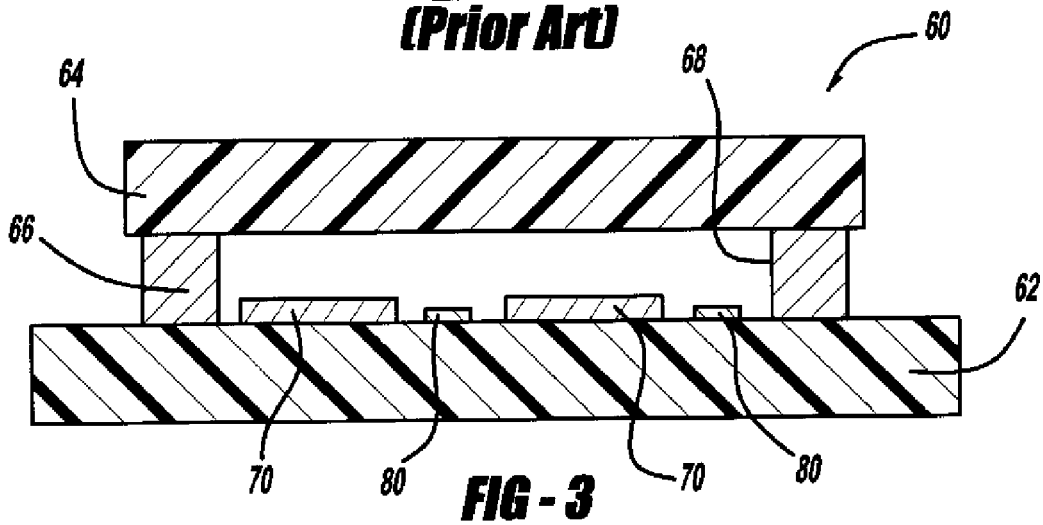
FIG. 3 is a cross-sectional view of a wafer-level package including hydrogen getters integrated to a semiconductor wafer, according to an embodiment of the present invention.

FIG. 3 is a cross-sectional view of a wafer-level package 60, according to an embodiment of the present invention. The wafer-level package 60 includes a semiconductor substrate wafer 62. A cover wafer 64 is bonded to the substrate wafer 62 by a bonding ring 66 to provide a hermetically sealed cavity 68 in the manner as discussed above. In one non-limiting embodiment, the substrate wafer 62 and cover wafer 64 are semiconductor wafers, such as GaAs, InP and GaN, or silicon. One or more integrated circuits 70 are fabricated on the substrate wafer 62 or the cover wafer 64 and are sealed within the cavity 68. The integrated circuits 70 are intended to represent any suitable RF circuit or MMIC for any particularly application, and can be devices such as micro-electromechanical switches, filters, HEMTs, etc. The cover wafer 64 can be any suitable cover wafer for wafer-level packaging, such as silicon, glass, or semiconductor substrates. The cover wafer 64 can include integrated circuits including any suitable RF circuit or MMIC for any particularly application, and can also be devices such as micro-electromechanical switches, filters, HEMTs, etc.

According to the invention, one or more hydrogen getters 80 are integrated within and among the integrated circuits 70. As the integrated circuits 70 are being fabricated for a particular device or circuit, the various layers associated with the hydrogen getters 80 are also being deposited. Therefore, the layers of the hydrogen getters 80 are deposited by any suitable wafer-level packaging and batch integration process that can be employed to fabricate the integrated circuits 70.

Figure 4:
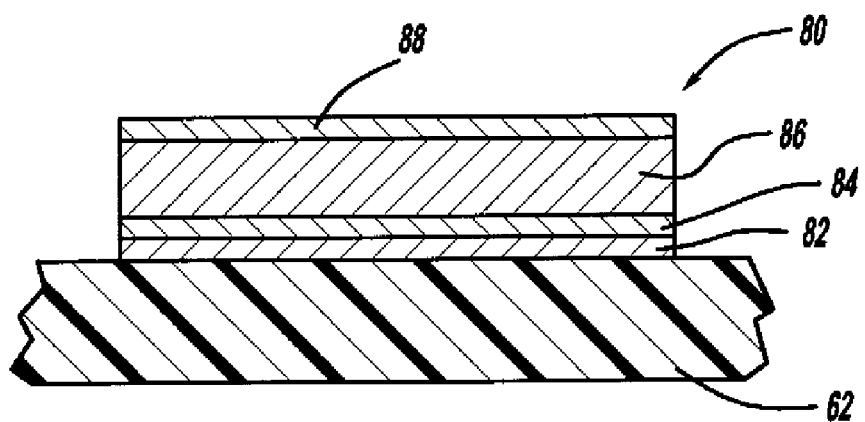
FIG. 4 is a cross-sectional view of one of the hydrogen getters shown in FIG. 3.

The hydrogen getters 80 are a lamination of thin layers formed on the substrate 62 or the cover wafer 64. A cross-sectional view of one of the hydrogen getters 80 on the substrate wafer 62 is shown in FIG. 4 separated from the wafer-level package 60. In this non-limiting embodiment, the hydrogen getter 80 includes a layer 82 of titanium deposited on the substrate wafer 12, a layer 84 of nickel deposited on the titanium layer 82, a layer 86 of titanium deposited on the nickel layer 84 and a layer 88 of palladium deposited on the titanium layer 86. The layers 82, 86 and 88 can have a thickness from sub-micron to several microns and the titanium layer 86 can have a thickness varying between a few microns to tens of microns.

Figure 5:
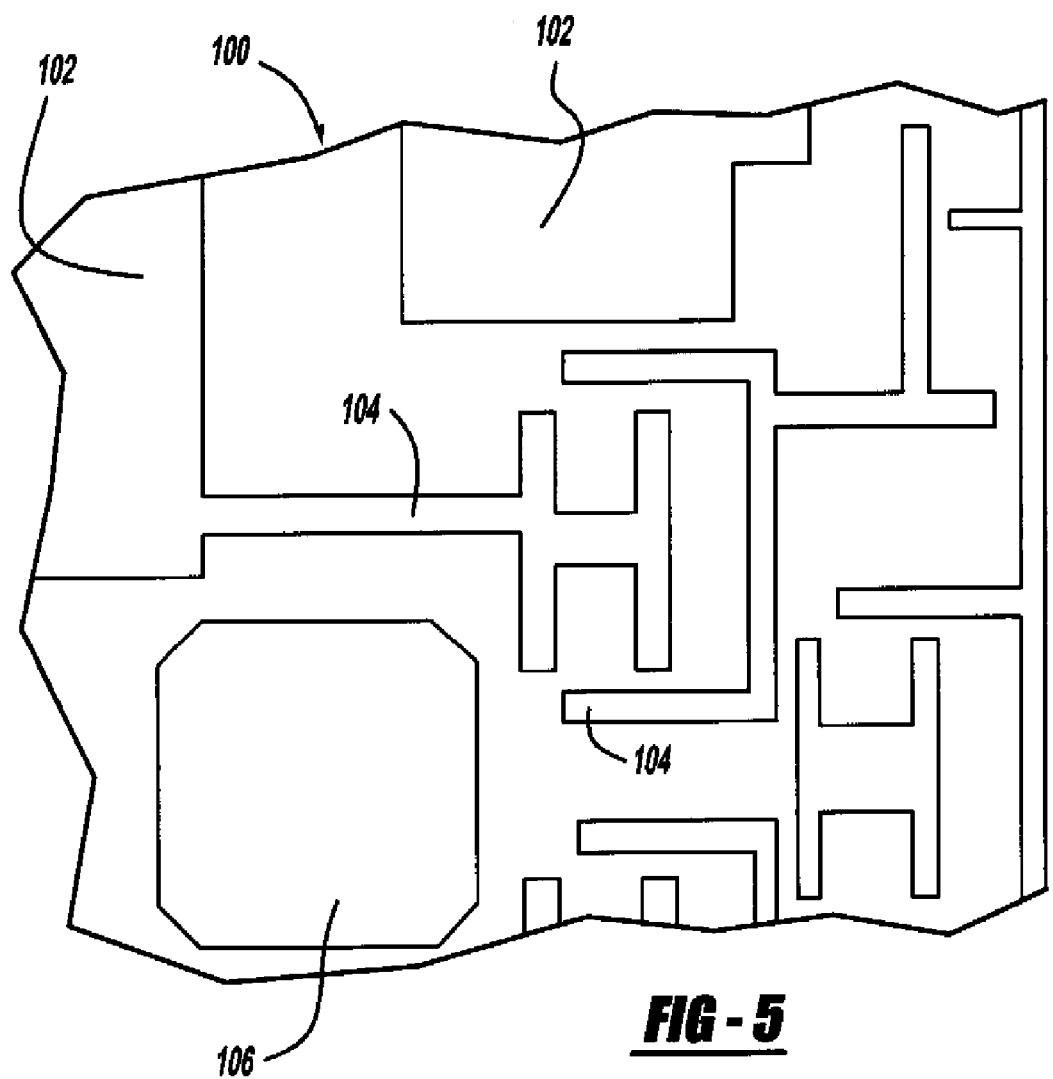
FIG. 5 is a top view of a substrate wafer showing an integrated hydrogen getter deposited thereon, according to another embodiment of the present invention.

FIG. 5 is a top view of a substrate wafer 100 of the type discussed above including a plurality of integrated circuits 102 and signal traces 104. An integrated hydrogen getter 106 of the type discussed above is shown deposited on the substrate wafer 100 at a suitable location to absorb hydrogen. FIG. 5 shows that the size and shape of the integrated hydrogen getter 106 would be selected for a particular integrated circuit design so that it would be of the appropriate size and shape depending on the circuit layout.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A wafer-level package comprising:
   a substrate wafer;
   a cover wafer mounted to the substrate wafer to form a hermetically sealed cavity;
   a plurality of integrated circuits formed on the substrate wafer or the cover wafer;
   a plurality of traces formed on the substrate wafer on which the plurality of integrated circuits are formed or the cover wafer on which the plurality of integrated circuits are formed; and
   a plurality of hydrogen getters interspersed within and among the plurality of integrated circuits, wherein the plurality of hydrogen getters are integrated hydrogen getters formed on the substrate wafer or the cover wafer when the integrated circuits are formed on the substrate wafer or the cover wafer, and wherein the plurality of hydrogen getters include a plurality of layers formed on a parallel plane with respect to the substrate wafer or the cover wafer and wherein the plurality of hydrogen getters are formed among the plurality of traces.

2. The wafer-level package according to claim 1, wherein the hydrogen getters include a titanium layer, a nickel layer, and a palladium layer.

3. The wafer-level package according to claim 2 wherein the hydrogen getters include a first titanium layer, a nickel layer deposited on the first titanium layer, a second titanium layer deposited on the nickel layer and a palladium layer deposited on the second titanium layer.

4. The wafer-level package according to claim 1 wherein the integrated circuits are monolithic millimeter-wave integrated circuits.

5. The wafer-level package according to claim 1 wherein the substrate wafer is a semiconductor wafer.

6. The wafer-level package according to claim 1 wherein the substrate wafer is a non-semiconductor material suitable for wafer-level packaging.

7. The wafer-level package according to claim 1 wherein the cover wafer is a semiconductor wafer.

8. The wafer-level package according to claim 1 wherein the cover wafer is a non-semiconductor material suitable for wafer-level packaging.

9. A wafer-level package comprising:
   a substrate wafer;
   a cover wafer mounted to the substrate wafer to form a hermetically sealed cavity;
   at least one integrated circuit formed on the substrate wafer or the cover wafer;
   a plurality of traces formed on the substrate wafer on which the at least one integrated circuit is formed or the cover wafer on which the at least one integrated circuit is formed; and
   a plurality of hydrogen getters formed on the substrate wafer or the cover wafer when the at least one integrated circuit is formed on the substrate wafer or the cover wafer, said plurality of hydrogen getters each including a plurality of layers formed on a parallel plane with respect to the substrate wafer or the cover wafer and wherein the plurality of hydrogen getters are formed between the at least one integrated circuit and the plurality of traces.

10. The wafer-level package according to claim 9 wherein the hydrogen getters include a titanium layer, a nickel layer and a palladium layer.

11. The wafer-level package according to claim 10 wherein the hydrogen getters include a first titanium layer, a nickel layer deposited on the first titanium layer, a second titanium layer deposited on the nickel layer and a palladium layer deposited on the second titanium layer.

12. The wafer-level package according to claim 9 wherein the at least one integrated circuit is a monolithic millimeter-wave integrated circuit.

* * * * *